United States Patent [19]

Hartley et al.

[11] Patent Number: 4,980,555

[45] Date of Patent: Dec. 25, 1990

[54] ELECTRICAL INTERCONNECTOR FOR INFRARED DETECTOR ARRAYS

[75] Inventors: Martha A. Hartley, Dracut; Lawrence D. Rakers, Burlington, both of Mass.

[73] Assignee: Honeywell Inc., Minneapolis, Minn.

[21] Appl. No.: 456,061

[22] Filed: Dec. 21, 1989

Related U.S. Application Data

[62] Division of Ser. No. 268,077, Oct. 31, 1988, abandoned.

[51] Int. Cl.$^5$ .............................................. H05K 1/11
[52] U.S. Cl. .................................. 250/338.3; 250/332; 427/99
[58] Field of Search ............... 250/338.3, 332; 427/99; 437/183

[56] References Cited

U.S. PATENT DOCUMENTS

| | | | |
|---|---|---|---|
| 3,236,707 | 2/1966 | Lins | 430/494 |
| 3,707,695 | 12/1972 | Yamaka | 338/13 |
| 3,965,568 | 6/1976 | Gooch | 437/3 |
| 4,039,833 | 8/1977 | Thom | 250/332 |
| 4,062,107 | 12/1977 | Blackman | 29/834 |
| 4,072,863 | 2/1978 | Roundy | 250/332 |
| 4,206,470 | 6/1980 | White | 357/30 |
| 4,354,109 | 10/1982 | White | 250/349 |
| 4,654,269 | 3/1987 | Lehrer | 428/428 |
| 4,740,700 | 4/1988 | Shaham et al. | 250/332 |

OTHER PUBLICATIONS

Dietrich W. Widmann, "Metallization for Integrated Circuits Using a Lift-Off Technique", IEEE Journal of Solid-State Circuits, vol. SC-11, No. 4, (Aug. 1976), pp. 466-471.

*Primary Examiner*—Constantine Hannaher
*Attorney, Agent, or Firm*—Haugen and Nikolai

[57] ABSTRACT

An electrical interconnect structure for pyroelectric detector arrays. The structure being a bump structure having a polyimide core surrounded by a layer of chromium indium and integrally mounted to a thin film of chromium which, in turn, is applied to a planar wafer of lithium tantalate.

12 Claims, 2 Drawing Sheets

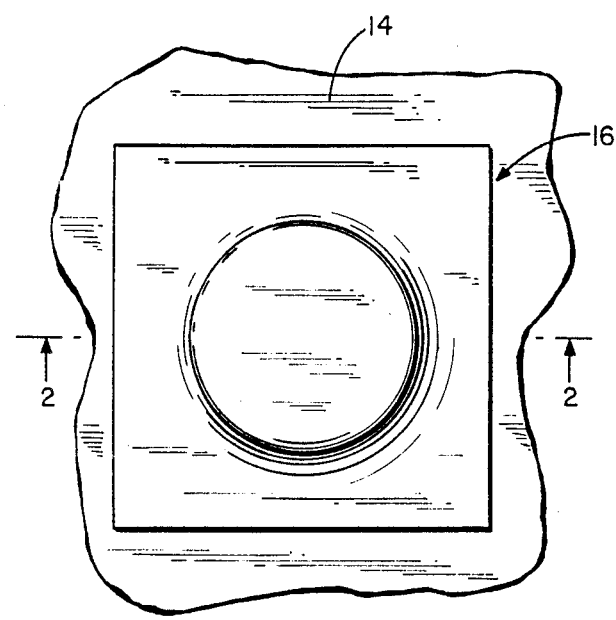
FIG. I
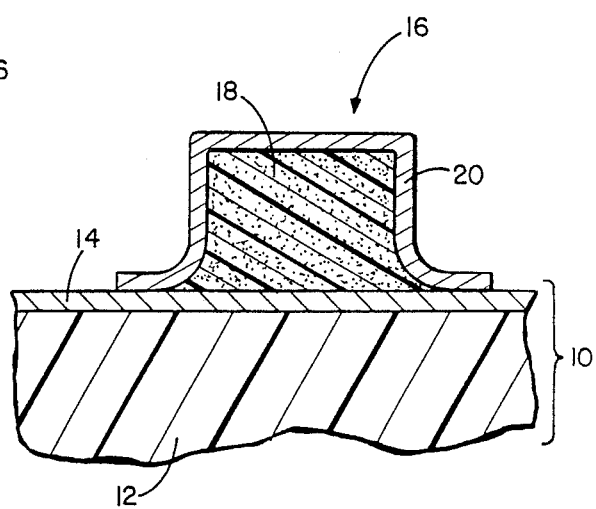
FIG. 2
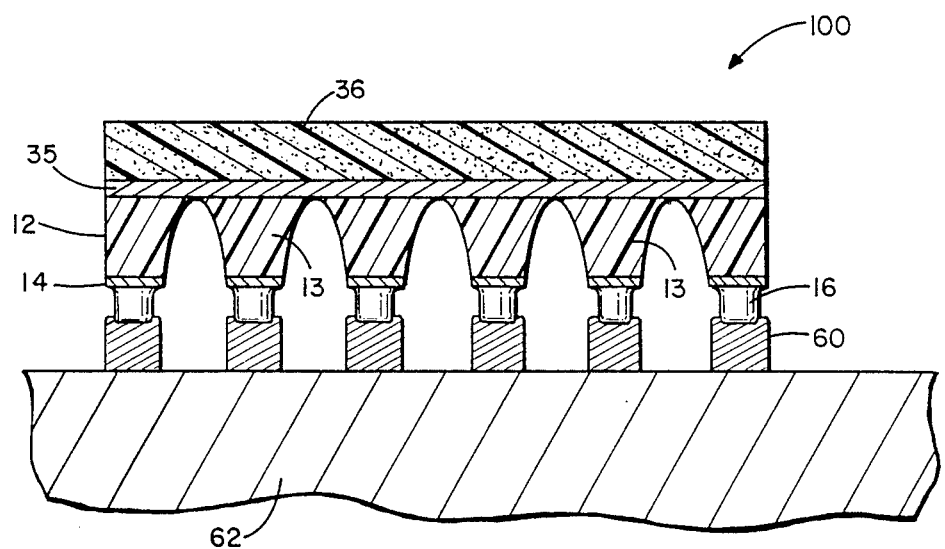
FIG. 3

ELECTRICAL INTERCONNECTOR FOR INFRARED DETECTOR ARRAYS

This is a division of co-pending application Ser. No. 268,077, filed on Oct. 31, 1988, now abandoned.

FIELD OF THE INVENTION

This invention relates to radiation sensor systems, such as infrared sensing systems and, in particular, relates to electrical connectors for infrared detectors comprising a bump structure having a rigid core of thermally insulating material covered by a layer of metal, and to infrared detector devices employing such interconnection structures.

BACKGROUND OF THE INVENTION

Present methods of interconnecting pyroelectric detector arrays to their associated electronics include using so-called "bump" connectors between the detector array substrate and the circuitry substrate. These bump connectors or contacts extend some distance above the surface of the material on which the contact is formed, so that electrical connection may be made through a layer of nonconductive material, for example. Prior art bump connectors are usually comprised of a solid metal, such as indium. Under appropriate pressure and temperature conditions, such bumps would allow for cold welding between bumps of like metals to achieve an interconnection from the electronics to the detector.

One major disadvantage of using such solid metal bumps for electrical interconnection is that solid metal bumps are highly thermally conductive and draw heat away from the detector to which they are connected. This results in a degraded thermal image signal from the detector. Yet another drawback of the known structures used for interconnecting detectors through bumps is that the cold weld formed often results in an unreliable electrical and mechanical interconnection because the indium bumps do not always weld together properly.

The invention overcomes the disadvantages of the prior art by providing a highly reliable method of interconnection which also offers a lower thermal conduction path.

SUMMARY OF THE INVENTION

The invention is an electrical interconnect structure comprising a substrate and a bump structure mounted on the substrate wherein the bump structure further comprises a metal evaporated around a rigid core material which thermally insulates a detector interconnected by the bump.

The substrate may comprise, for example, lithium tantalate (Li Ta O$_3$ hereinafter referred to as "LTO") having a layer of chromium on one surface. The metal used to envelope the core material may be chromium and indium in the preferred embodiment of the invention and the core material may advantageously be comprised of polyimide.

It is one primary object of the invention to provide a highly reliable method of interconnection for infrared detector arrays.

It is yet another object of the invention to provide an electrical interconnection which also offers a lower thermal conductive path than such interconnections used in the prior art.

It is yet another object of the invention to provide highly improved cold welded interconnections.

It is yet another object of the invention to provide an infrared detector device having highly reliable electrical interconnects between the detector array and the associated electronics.

It is yet another object of the invention to provide an infrared detector device having electrical interconnects between the detector array and associated electronics which exhibit a lower amount of thermal conduction than prior art devices.

Other objects, advantages and features of the invention will become apparent to those skilled in the art through reference to the detailed description of the preferred embodiment, claims and drawings herein wherein like numerals refer to like elements.

BRIEF DESCRIPTION OF THE DRAWINGS

FIG. 1 shows a planar top view of the bump interconnection of the invention.

FIG. 2 illustrates schematically a side cross-cut view of the electrical bump interconnection of the invention taken along line 2—2 of FIG. 1.

FIG. 3 shows one embodiment of an infrared detector device employing rigid core interconnections in cross-sectional side view.

DETAILED DESCRIPTION OF THE PREFERRED EMBODIMENTS

Figure 4:
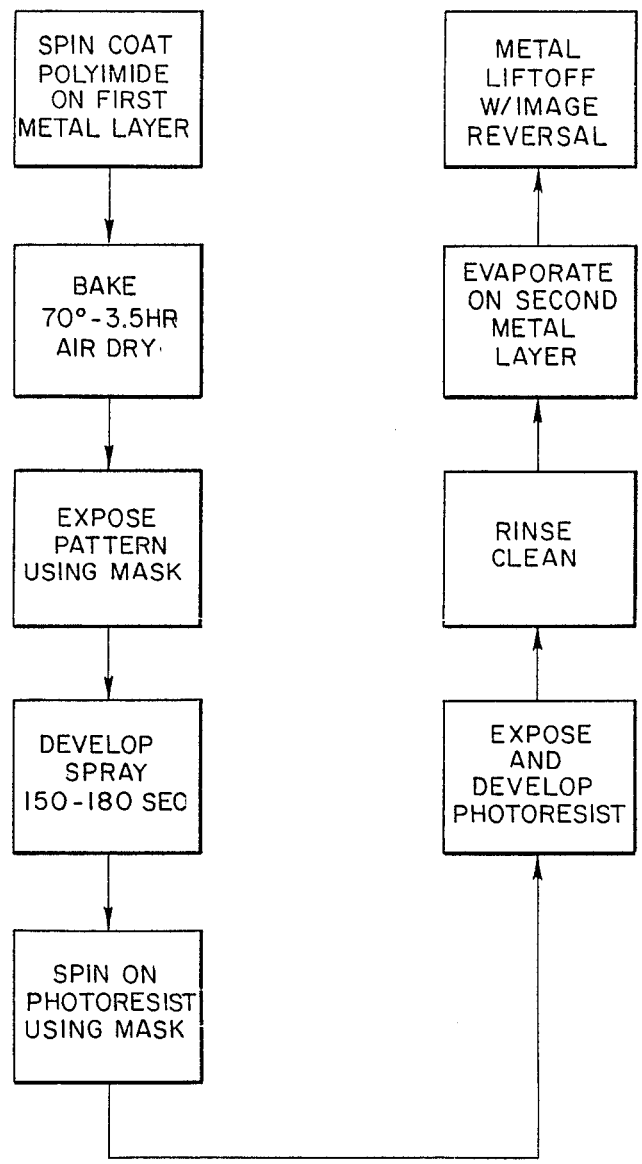
FIG. 4 is a schematic block diagram illustrating steps of the bump process of the invention.

As is best shown in FIGS. 1 and 2, the electrical inter-connection of the invention comprises a substrate 10, and an electrical interconnect bump structure 16 integrally attached to the substrate 10. The electrical interconnect bump structure comprises an inner core 18 and an outer layer 20 covering the inner core.

In one embodiment of the invention the substrate 10 is preferably comprised of a wafer made of lithium tantalate. In an alternative embodiment of the invention, the substrate 10 may comprise a first layer 14 and a second layer 12. For example, the second layer may be a lithium tantalate wafer 12 advantageously covered by a first layer of metal film 14 of, for example, chromium. The core 18 is preferably comprised of polyimide. One such polyimide found to be advantageously used as the core material is Selectilux TM HTR-3-200, which is manufactured by Merck, a German chemical company.

Several experiments were conducted by the Electro-Optics Division of Honeywell, Inc., in Lexington, Mass., some polyimide core bumps as described above, were made on both real and simulated detector arrays. The arrays were then cold welded or "bumped" to CCD electrical components. The polyimide core bump structure was found to exhibit a very strong cold weld to a solid indium bump. The polyimide core bumps showed an improved cold weld over standard all-indium bumps. It is hypothesized that this is due to the rigidity of the polyimide core. The core apparently acts as a battering ram and breaks up the indium oxide on the outer edges of the bumps. This allows true indium cold welding to take place. Further, actual arrays made with polyimide core bumps showed improved video imagery due to lower thermal conduction.

ILLUSTRATIVE EXAMPLE OF PROCESSING OF THE BUMP

In order to further explain the invention, an illustrative example of one process used in forming such interconnects will prove useful and is described in detail as follows. The steps of the process, as described below, are outlined in the schematic drawing of FIG. 4.

The illustrative polyimide core bump process is a low temperature process and advantageously uses a special photosensitive polyimide bump called Selectilux TM HTR-3-200 as described above. This process requires a special developer, Selectilast TM HTR-D-2, also manufactured by Merck. This polyimide is photosensitive and essentially acts very much like a negative photoresist. Those skilled in the art will recognize that polyimides other than Selectilux TM HTR-3-200 may be used as well as other organic materials like photoresist. With further reference to FIG. 4, the process steps used in the example were as follows:

1. Selectilux HTR-3-200 was spun onto a chromium metal layer at 5000 rpm for 30 seconds. The resulting layer of polyimide was about 8 microns thick.

2. The part was next soft baked at 70° C. for 3.5 hours and air-dried for a short period of time.

3. The polyimide was exposed for about 105 seconds using a dark field mask and the polyimide was developed for 150 to 180 seconds with a spray developer, Selectiplast TM HTR-D-2. The part was rinsed in isopropyl alcohol.

4. Next, Shipley 4620 was spun on at 5000 rpm for 30 seconds. Shipley 4620 is manufactured by American Hoechst Corporation, AZ Photoresist Products of Somerville, N. J. A mask with a pattern larger than the polyimide core was used. See FIG. 1 for a relative view of the result of using the different sized patterns of photo masks in processing the electrical interconnect bump of the invention. Image reversal techniques were used to enhance the eventual metal liftoff. As part of this process, the resist and polyimide saw a 9° C. bake. These bakes also serve as the cure for the polyimide. After the resist was developed, the part was rinsed and then cleaned in an $O_2$ plasma.

5. A metal film was then evaporated over the polyimide core using a planetary fixture. The film used in this example of the invention was a 100A of chrome and 10,000A of indium.

6. The part bearing the polyimide core bumps was then bump connected to CCD electronics having pure indium bumps using 3168g of bumping force.

The above processing steps are meant to serve as an illustrative example of one way to make the electrical interconnects of the invention. Those skilled in the art will recognize that there are various other methods and modifications of the above process which will still accomplish the invention.

INFRARED DETECTOR ARRAY

Referring now to FIG. 3, one embodiment of an infrared detector device 100 employing rigid core interconnections 16 is shown in a cross-sectional side view. The detector device 100 comprises a protective layer of polyimide 36 applied by well-known methods, such as is described above, over a first metal layer 35 which is evaporated onto a substrate 12 comprised of a thermal-sensitive material suitable for detecting infrared radiation and etched appropriately to form individual detector elements 13. A metal layer 14 may be applied as explained above with respect to FIGS. 1 and 2. An interconnect bump 16 is formed on each detector element according to a method such as is detailed above. The interconnect bump 16 is comprised of materials as explained above with reference to FIGS. 1 and 2. The interconnect bumps 16 are cold welded to metallic bumps 60 which are, in turn, connected to electronics on CCD chip 62 for processing electronic signals generated by the detector array comprised of layers 35 and 36, and the etched wafer 12. Such processing electronics are well known and may comprise various analog or digital techniques depending upon the application or environment in which the infrared detectors are to be deployed.

In one embodiment of the invention, the rigid core interconnections are comprised of a polyimide core covered by a layer of a metal consisting of chromium and indium. The first metal layer 35 and the second layer 14, if used, may advantageously be comprised of chromium. The thermal sensitive material 12 which is etched into individual detector elements 13 may be comprised of LTO. Those skilled in the art will recognize that other thermal sensitive materials may be used. The solid metal interconnect bump 60 may advantageously be comprised of indium which is, in turn, attached to a chip 62 comprised mainly of silicon having LSI or VLSI components embedded therein.

It should be understood that various combinations of the techniques and principles taught by the present patent may be utilized without departing from the spirit and scope of the invention. Implementations which will be apparent to those skilled in the art are to considered within the scope of the present invention, so I do not wish to be limited to the specific disclosures used in connection with the preferred embodiment.

What is claimed is:

1. An improved method for fabricating an electrical interconnector for cold welding infrared detector arrays comprising the steps of:
    (a) spinning an amount of photosensitive polyimide material onto a first metal layer carried by a substrate forming a composite structure;
    (b) soft baking the polyimide and metal composite structure;
    (c) exposing and developing the polyimide layer;
    (d) spinning a photoresist layer onto the polyimide and metal composite structure using a mask larger than that desired for the polyimide interconnection size or core size;
    (e) exposing and developing the photoresist layer;
    (f) evaporating a second metal/film layer onto the polyimide core; and
    (g) lifting the photoresist material off of the structure using a metal liftoff technique.

2. The method of claim 1 wherein the first metal layer is composed substantially of chromium.

3. The method of claim 2 wherein the second metal layer is composed substantially of a composite consisting of approximately 100A of chromium and 10,000A of indium.

4. The method of claim 3 further comprising the step of bump connecting the structure to CCD electronics having pure indium bumps.

5. The method of claim 4 wherein said connection is made using 3,200 or less g of bumping force.

6. A structure fabricated in accordance with the method of claim 3.

7. The method of claim 1 wherein the second metal layer is composed substantially of a composite consisting of approximately 100A of chromium and 10,000A of indium.

8. The method of claim 1 further comprising the step of applying image reversal techniques to enhance the metal liftoff.

9. The method of claim 1 further comprising the step of bump connecting the structure to CCD electronics having pure indium bumps.

10. The method of claim 9 wherein said connection is made using 3,200 or less g of bumping force.

11. A structure fabricated in accordance with the method of claim 9.

12. A structure fabricated in accordance with the method of claim 1.

* * * * *